United States Patent
Lash et al.

(10) Patent No.: US 7,319,419 B1
(45) Date of Patent: Jan. 15, 2008

(54) SWITCHED CAPACITOR CIRCUIT WITH CURRENT SOURCE OFFSET DAC AND METHOD

(75) Inventors: Christopher P. Lash, Portland, OR (US); Ronald F. Cormier, Jr., Tucson, AZ (US); Frederick J. Highton, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/512,389

(22) Filed: Aug. 30, 2006

(51) Int. Cl.
*H03M 1/06* (2006.01)
(52) U.S. Cl. ........................... 341/118; 341/124
(58) Field of Classification Search ......... 341/118–150
See application file for complete search history.

(56) References Cited

U.S. PATENT DOCUMENTS 6,271,784 B1 * 8/2001 Lynn et al. ................. 341/150
7,250,886 B1 * 7/2007 Killat et al. ................ 341/143

* cited by examiner

*Primary Examiner*—Rexford Barnie
*Assistant Examiner*—Lam T. Mai
(74) *Attorney, Agent, or Firm*—Wade J. Brady, III; Frederick J. Telecky, Jr.

(57) ABSTRACT

A switched-capacitor sample/hold circuit includes a switched-capacitor input sampling stage and a sample/hold amplifier circuit including an operational amplifier having first and second inputs coupled to first and second input sampling capacitors, respectively, and first and second feedback capacitors coupled between the first and second inputs and first and second outputs of the operational amplifier. A continuous-time offset DAC receives a digital input signal representative of an offset voltage produces first and second offset correction voltages. The first and second offset correction voltages are coupled to the switched-capacitor sample/hold circuit to adjust the amount of pre-charging of the first and second feedback capacitors, respectively, in accordance with the value of the digital input signal to compensate an offset component associated with the and second input voltages. The output of the switched-capacitor sample/hold circuit can be connected to an ADC.

20 Claims, 7 Drawing Sheets

SWITCHED CAPACITOR CIRCUIT WITH CURRENT SOURCE OFFSET DAC AND METHOD

BACKGROUND OF THE INVENTION

The present invention relates generally to switched capacitor circuits, and more particularly to offset-compensated switched-capacitor sample/hold circuits and to switched-capacitor ADCs (analog to digital converters), and more particularly to faster, lower cost circuitry for offset-compensated switched-capacitor sample/hold circuits and to switched-capacitor ADCs which include them.

In switched-capacitor ADCs utilized to sense a CMOS light sensor, it often is desirable to utilize the output of a switched-capacitor offset DAC to compensate for a "dark light offset voltage", which is the output voltage produced by the CMOS sensor in the absence of any ambient light. That offset voltage must be subtracted from the CMOS sensor output voltage measured when the ambient light is present in order to obtain an accurate measurement of the ambient light intensity.

"Prior Art" FIGS. 1A and 1B show an offset-compensated switched-capacitor sample/hold circuit 1 which includes a basic switched capacitor sample/hold circuit 2 and a switched-capacitor offset DAC 3, the output of which is coupled to summing junctions at the inputs of a sample/hold amplifier 11. Switched-capacitor sample/hold circuit 2 includes a conventional switched-capacitor stage that samples input voltages Vin$^+$ and Vin$^-$ onto input sampling capacitors 7A and 7B, respectively, each of which has a capacitance $C_{IN}$. The sampled charge then is redistributed through conductors 9A and 9B onto feedback capacitors 12A and 12B, each of which has a capacitance $C_{FB}$.

Switched-capacitor offset DAC 3 operates in response to a digital input signal B0,B1 . . . BM, where M=$2^N$−1, typically to produce a "dark light" compensation signal on summing junction conductors 9A and 9B so that an analog output signal Vout$^+$−Vout$^-$ produced by combined switched-capacitor sample/hold circuit 1 presents a value that accurately represents ambient light intensity of a CMOS light sensor which produces the input signal Vin$^+$−Vin$^-$. That value typically is applied to the input of an ADC. Switched-capacitor offset DAC 3 is a relatively large, costly circuit which includes $2^N$ switched-capacitor stages 3−0,2 . . . $2^N$−1 as shown, or alternatively, switched-capacitor offset DAC 3 includes N binarily weighted switched-capacitor stages. (Note that using N binarily weighted switched-capacitor stages in switched-capacitor offset DAC 3 requires fewer capacitors, but the overall large amount of capacitance remains unchanged.)

Prior Art FIG. 2 shows a variation in which the switched-capacitor offset DAC is incorporated into the switched-capacitor input sampling stage 3A, as shown. In this case, the capacitors of the switched-capacitor offset DAC 3A also function as the sampling capacitors of the offset-compensated switched-capacitor sample/hold circuit.

Typically, the feedback capacitors $C_{FB}$ are precharged to a common mode voltage $V_{CMO}$ at the same time the two input sampling capacitors $C_{IN}$ are being charged to the input voltages Vin$^+$ and Vin$^-$, respectively. It should be appreciated that there are various well-known switched-capacitor DACs which can be used in the above offset-compensated switched capacitor sample/hold circuit 1. The disadvantages are essentially the same for most or all of the variations. For example, more bandwidth is needed for the amplifier, more integrated circuit chip area is required, more parasitic devices are present, and more noise is present because the additional switched capacitors generate increased amounts of kT/C noise which is added to the kT/C noise generated by the input sampling capacitors.

It would be desirable to have a way of implementing the basic functions of the offset-compensated switched-capacitor sample/hold circuits of Prior Art FIGS. 1 and 2 without compromising the speed and noise performance and simplicity of a simple sample/hold circuit. The outputs of the prior art switched-capacitor offset DAC shown in FIGS. 1A and 1B cause substantial capacitive loading on the summing junctions of the operational amplifier 11, thereby degrading the feedback factor and hence the circuit speed and noise. (The feedback factor is the ratio of the feedback capacitance to the sum of the input capacitance and the feedback capacitance, and is proportional to circuit speed and inversely proportional to circuit noise.) The circuit shown in FIG. 2 reduces these problems, but the switched-capacitor offset DACs in both FIGS. 1 and 2 are too large and complex for use with ADCs having multiplexed inputs because their large size and large numbers of capacitors and associated signal routing conductors tends to be incompatible with high-speed, low-noise circuit operation.

Thus, there is an unmet need for faster, lower cost, lower noise offset-compensated switched-capacitor sample/hold circuits and ADCs than have been available in the prior art.

SUMMARY OF THE INVENTION

It is an object of the present invention to provide a faster, lower cost, offset-compensated switched-capacitor sample/hold circuit than has been available in the prior art.

It is another object of the invention to provide a faster, lower cost offset-compensated switched-capacitor ADC than has been available in the prior art.

It is another object of the invention to provide a faster, lower cost offset-compensated switched-capacitor ADC having lower noise than the closest prior art.

It is another object of the invention to provide a switched-capacitor ADC circuit capable of removing or canceling unwanted known components of analog input voltages with faster circuit speed, lower cost, and less noise than prior art ADC circuits.

It is another object of the invention to provide a faster, lower cost offset-compensated switched-capacitor ADC than has been available in the prior art and which is more suitable in applications in which multiple-channel input signals are multiplexed to the ADC.

Briefly described, and in accordance with one embodiment, the present invention provides a switched-capacitor sample/hold circuit (31A,31B) includes a switched-capacitor input sampling stage (31A) and a sample/hold amplifier circuit (31B) including an operational amplifier (11) having first (−) and second (+) inputs coupled to first (7A) and second (7B) input sampling capacitors, respectively, and first (12A) and second (12B) feedback capacitors coupled between the first and second inputs and first (15A) and second (15B) outputs of the operational amplifier. A continuous-time offset DAC (32) receives a digital input signal (33) representative of an offset voltage produces first ($V_{DAC}{}^+$) and second ($V_{DAC}{}^-$) offset correction voltages. The first and second offset correction voltages are coupled to the switched-capacitor sample/hold circuit to adjust the amount of pre-charging of the first and second feedback capacitors, respectively, in accordance with the value of the digital input signal to compensate an offset component associated with the first and second input voltages. The output of the switched-capacitor sample/hold circuit can be connected to an ADC.

In a described embodiment, the invention provides circuitry (30) including a switched-capacitor sample/hold circuit (31A,31B), a switched-capacitor input sampling stage (31A) including a first input sampling capacitor (7A) for sampling a first input voltage ($V_{in}^+$), a sample/hold amplifier circuit (31B) including an operational amplifier (11) having a first input (−) coupled to the first input sampling capacitor (7A), a first feedback capacitor (12A) coupled between the first input (−) and a first output (15A) of the operational amplifier (11), and first switching circuitry (14A,B) coupling the first feedback capacitor (12A) to the first output (15A) of the operational amplifier. A continuous-time offset DAC (digital to analog converter) (32) receives a digital input signal (33) representative of an offset voltage and has a first output (36) producing a first ($V_{DAC}^+$) offset correction voltage to represent the offset voltage. Second switching circuitry (13A,B) couples the first offset correction voltage ($V_{DAC}^+$) to the switched-capacitor sample/hold circuit (31A, 31B) to adjust an amount of pre-charging of the first feedback capacitor (12A) in accordance with the digital input signal (33). In a described embodiment, switched-capacitor input sampling stage (31A) includes a second sampling capacitor (7B) for sampling a second ($V_{in}^-$) input voltage, wherein the operational amplifier (11) includes a second input (+) coupled to the second input sampling capacitor (7B), and wherein a second feedback capacitor (12B) is coupled between the second input (+) and a second output (15B) of the operational amplifier (11). The second switching circuitry (14A,B) couples the second feedback capacitor (12B) to the second output (15B) of the operational amplifier. The continuous-time offset DAC (32) includes a second output (37) producing a second offset correction voltage ($V_{DAC}^-$) to represent the offset voltage. The first switching circuitry (13A,B) couples the second offset correction voltage ($V_{DAC}^-$) to the switched-capacitor sample/hold circuit (31A,31B) to adjust an amount of pre-charging of the second feedback capacitor (12B) in accordance with the digital input signal (33).

In one embodiment, the first switching circuitry (14A,B) includes a first switch (14A) controlled by an integrate phase signal (P2) and coupled between a first terminal (22A) of the first feedback capacitor (12A) and the first output (15A) of the operational amplifier, and a second switch (14B) controlled by the integrate phase signal (P2) and coupled between a first terminal (22B) of the second feedback capacitor (12B) and the second output (15B) of the operational amplifier. The second switching circuitry (13A,B) includes a third switch (13A) controlled by a reset phase signal (P1) and coupled between the first terminal (22A) of the first feedback capacitor (12A) and the first output (36) of the continuous-time offset DAC (32), and a fourth switch (13B) controlled by the reset phase signal (P1) and coupled between the first terminal (22B) of the second feedback capacitor (12B) and the second output (37) of the continuous-time offset DAC (32).

In a described embodiment, the switched-capacitor input sampling stage (31A) includes a fifth switch (10A) controlled by the reset phase signal (P1) and coupled between a second terminal (9A) of the first feedback capacitor (12A) and a reference voltage conductor (GND), a sixth switch (10B) controlled by the reset phase signal (P1) and coupled between a second terminal (9B) of the second feedback capacitor (12B) and the reference voltage conductor (GND), a first terminal of the first input sampling capacitor (7A) being connected to the second terminal (9A) of the first feedback capacitor (12A) and a first terminal of the second input sampling capacitor (7B) being connected to the second terminal (9B) of the second feedback capacitor (12B), a seventh switch (8A) controlled by the integrate phase signal (P2) being coupled between the reference voltage conductor (GND) and a second terminal (6A) of the first input sampling capacitor (7A), and an eighth switch (8B) controlled by the integrate phase signal (P2) being coupled between the reference voltage conductor (GND) and a second terminal (6B) of the second input sampling capacitor (7B).

In a described embodiment, the second switching circuitry (8A,B in FIG. 5) includes a third switch (8A) controlled by the integrate phase signal (P2) coupled between the first offset correction voltage ($V_{DAC}^+$) and a first terminal (6A) of the first input sampling capacitor (7A), and a fourth switch (8B) controlled by the integrate phase signal (P2) coupled between the second offset correction voltage ($V_{DAC}^-$) and a first terminal (6B) of the second input sampling capacitor (7B). A fifth switch (13A) controlled by a reset phase signal (P1) is coupled between the first terminal (22A) of the first feedback capacitor (12A) and a common mode voltage ($V_{CMO}$), and a sixth switch (13B) controlled by the reset phase signal (P1) is coupled between the second terminal (22B) of the second feedback capacitor (12B) and the common mode voltage ($V_{CMO}$).

In one embodiment, the continuous-time offset DAC (32) includes a current DAC producing an output current which flows through an output resistor (38) to produce the first offset correction voltage ($V_{DAC}^+$) in response to the digital input signal (33). The continuous-time DAC (32) includes N pairs of current steering transistors (41A-C,42A-C) operative to selectively steer each of N corresponding binarily weighted current sources (40A-C) into one or the other of the first (36) and second (37) outputs of the continuous-time DAC in accordance with corresponding bits of the digital input signal (33), a first constant current source (45) coupled to sink current from the first output (36) of the continuous-time DAC, a second constant current source (46) coupled to sink current from the second output (37) of the continuous-time DAC, a first output resistor (47) coupled between the first output (36) of the continuous-time DAC and a common mode voltage ($V_{CMO}$), and a second output resistor (48) coupled between the second output (37) of the continuous-time DAC and the common mode voltage ($V_{CMO}$).

In another embodiment, the continuous-time DAC (32) includes a first group including N pairs of current steering transistors (41A-C,42A-C) operative to selectively steer each of N corresponding binarily weighted current sources (40A-C) into one or the other of the first (36) and second (37) outputs of the continuous-time DAC in accordance with corresponding bits of the digital input signal (33). A reference amplifier (52) produces a first reference voltage ($V_{ref}^+$) on a first reference voltage conductor (35A) and a second reference voltage ($V_{ref}^-$) on a second reference voltage conductor (35B). A second group including N pairs of current steering transistors (41E-G,42E-G) operates to selectively steer each of N corresponding binarily weighted current sources (40E-G) into one or the other of the first (35A) and second (35B) reference voltage conductors in accordance with corresponding bits of the digital input signal (33). A first constant current source (45A) is coupled to sink current from the first output (36) of the continuous-time DAC, a second constant current source (46A) is coupled to sink current from the second output (37) of the continuous-time DAC, a third constant current source (45B) is coupled to sink current from the first reference voltage conductor (35A), and a fourth constant current source (46B) is coupled to sink current from the second reference voltage conductor (35B). A first output resistor (47) is coupled between the first output (36) of the continuous-time DAC and the first reference voltage conductor (35A), and a second output resistor (48) is coupled between the second output (37) of the continuous-time DAC and the second reference voltage conductor (35B). The switched-capacitor sample/hold circuit (31A,31B) includes a ninth switch (16) controlled by the reset phase signal (P1) coupled between the first (15A) and second (15B) outputs of the operational amplifier (11).

In the described embodiments, an ADC (analog to digital converter) has an input coupled to the first output (15A) of the operational amplifier (11).

In one embodiment, the invention provides a method of operating a switched-capacitor sample/hold circuit (31A, 31B) including a switched-capacitor input sampling stage (31A) and a sample/hold amplifier circuit (31B) including an operational amplifier (11) having a first input (−) coupled to a first input sampling capacitor (7A), and a first feedback capacitor (12A) coupled between the first input (−) and a first output (15A) of the operational amplifier, the method including operating a continuous-time offset DAC (digital to analog converter) (32) having a digital input signal (33) representative of an offset voltage component of an input voltage (Vin$^+$−Vin$^−$) sampled by the switched-capacitor input sampling stage (31A) to produce a first offset correction voltage ($V_{DAC}^+$), and coupling the first offset correction voltage ($V_{DAC}^+$) to the switched-capacitor sample/hold circuit (31A,31B) to adjust an amount of pre-charging of the first feedback capacitor (12A) in accordance with the value of the digital input signal (33) to compensate the offset voltage component.

In one embodiment, the invention provides circuitry including a switched-capacitor sample/hold circuit (31A, 31B) including a switched-capacitor input sampling stage (31A) and a sample/hold amplifier circuit (31B) including an operational amplifier (11) having a first input (−) coupled to a first input sampling capacitor (7A), and a first feedback capacitor (12A) coupled between the first input (−) and a first output (15A) of the operational amplifier, continuous-time offset DAC (digital to analog converter) means (32) having a digital input signal (33) representative of an offset voltage component of an input voltage (Vin$^+$−Vin$^−$) sampled by the switched-capacitor input sampling stage (31A) to produce a first offset correction voltage ($V_{DAC}^+$), and means for coupling the first offset correction voltage ($V_{DAC}^+$) to the switched-capacitor sample/hold circuit (31A,31B) to adjust an amount of pre-charging of the first feedback capacitor (12A) in accordance with the value of the digital input signal (33) to compensate the offset voltage component.

DETAILED DESCRIPTION OF THE PREFERRED EMBODIMENTS

Figure 1A:
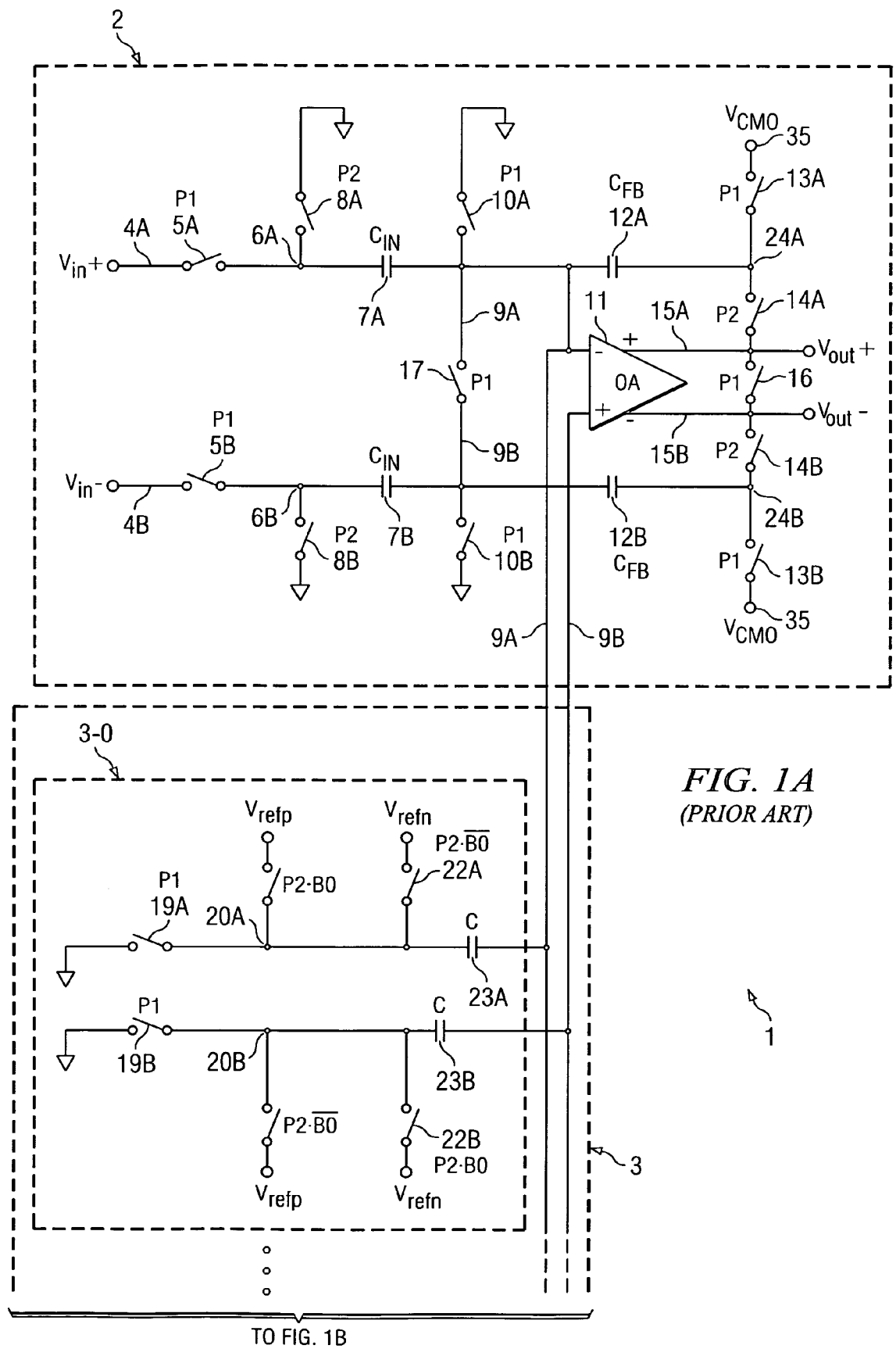
FIGS. 1A and 1B constitute a schematic diagram of a conventional switched-capacitor sample/hold circuit.
Figure 1B:
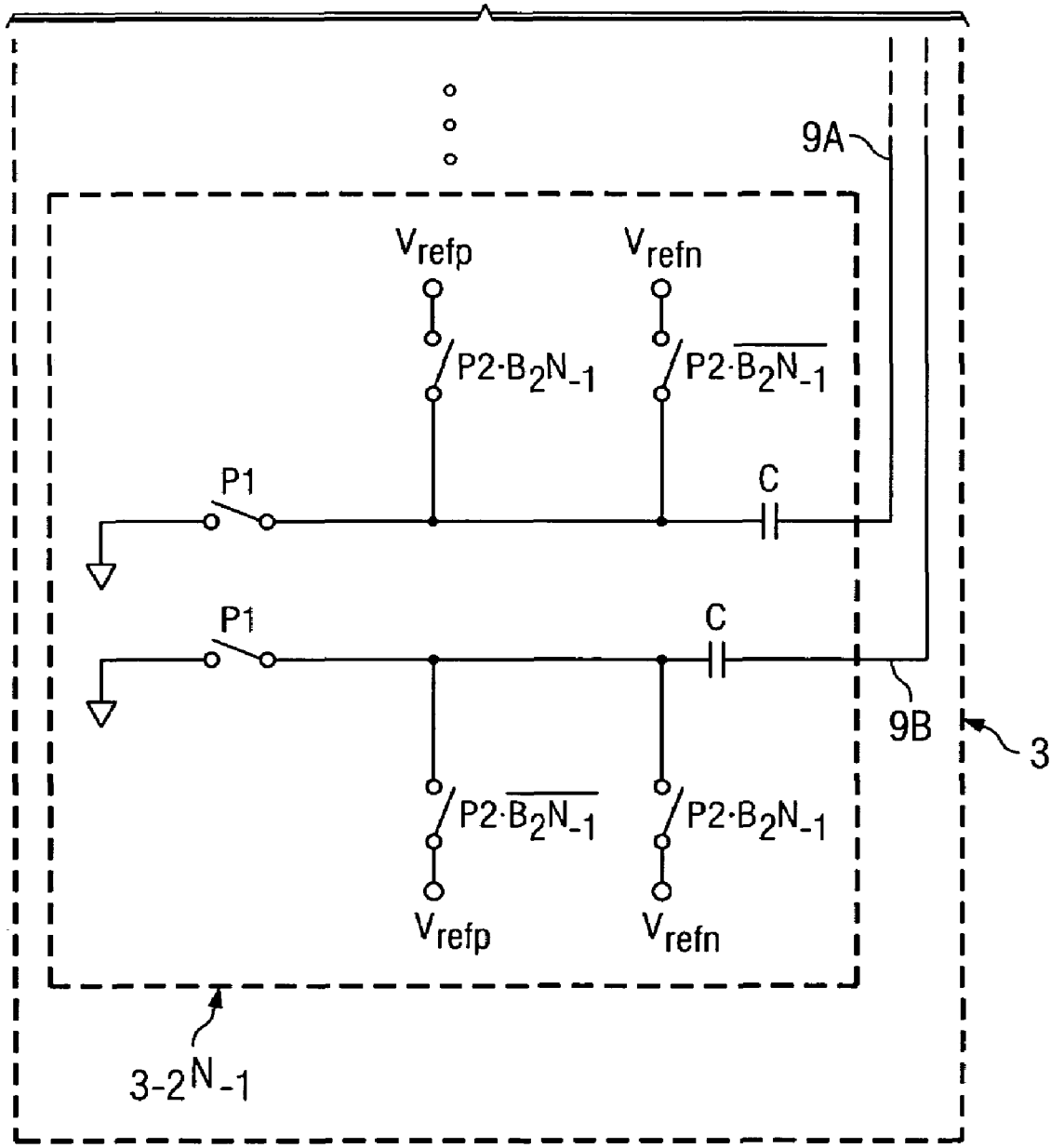
Figure 2:
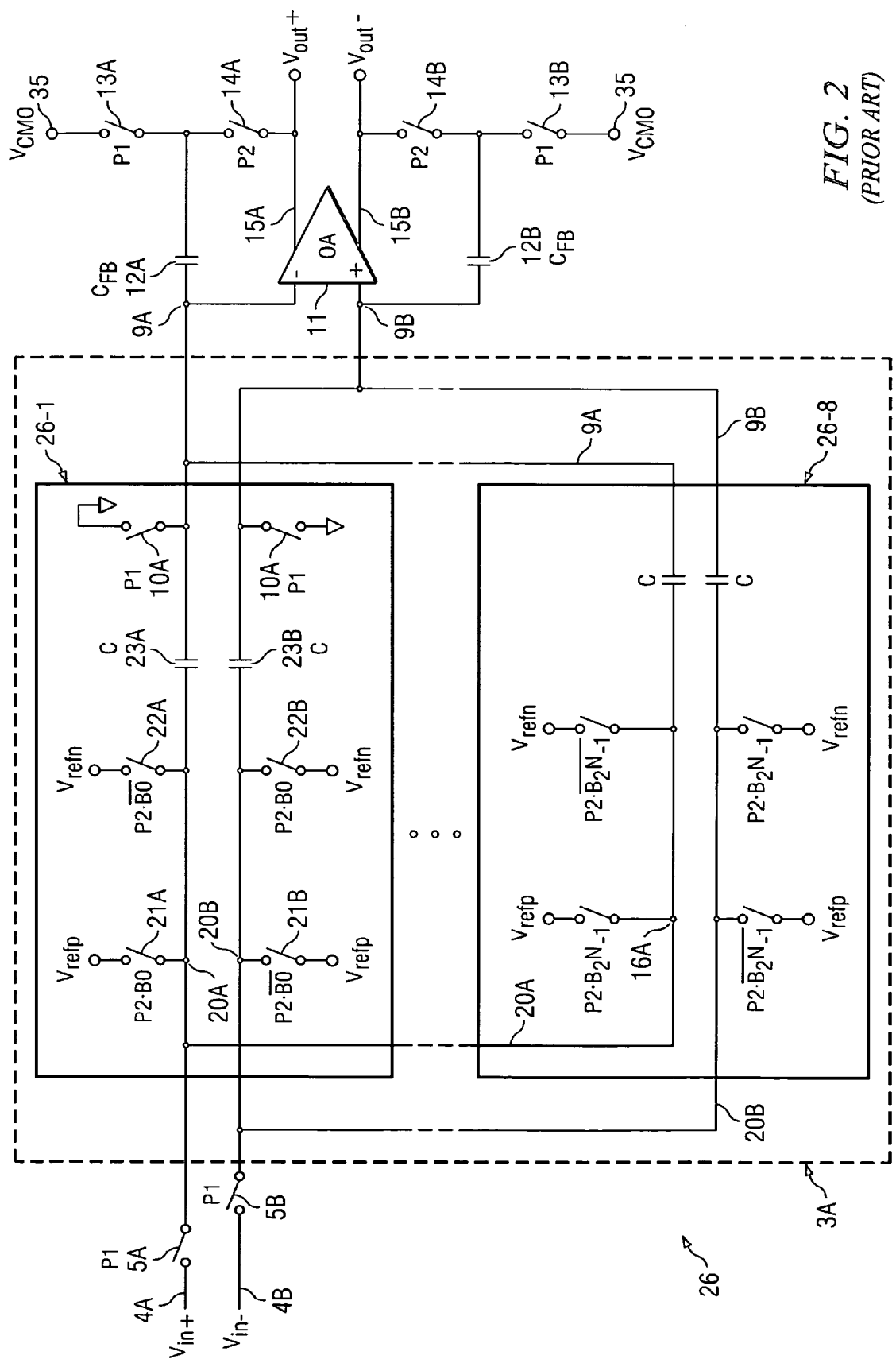
FIG. 2 is a schematic diagram of another conventional switched-capacitor sample/hold circuit.

The present invention provides an effective solution to the problems of the previously described prior art by replacing the switched-capacitor offset DAC 3 of FIGS. 1A and 1B with a continuous-time offset DAC 32 (sometimes referred to as a "CT-DAC") having its output terminals coupled to summing junctions 9A and 9B, respectively, of operational amplifier 11 and hence to its two feedback capacitors $C_{FB}$ during a "reset" phase P1, as shown in subsequently described FIG. 3. Alternatively, the outputs of the continuous-time offset DAC can be coupled to the two input capacitors $C_{IN}$, respectively, of the switched-capacitor input sampling stage 31A during an "integrate" phase P2 to achieve the same effect, as shown in subsequently described FIG. 5.

Figure 3:
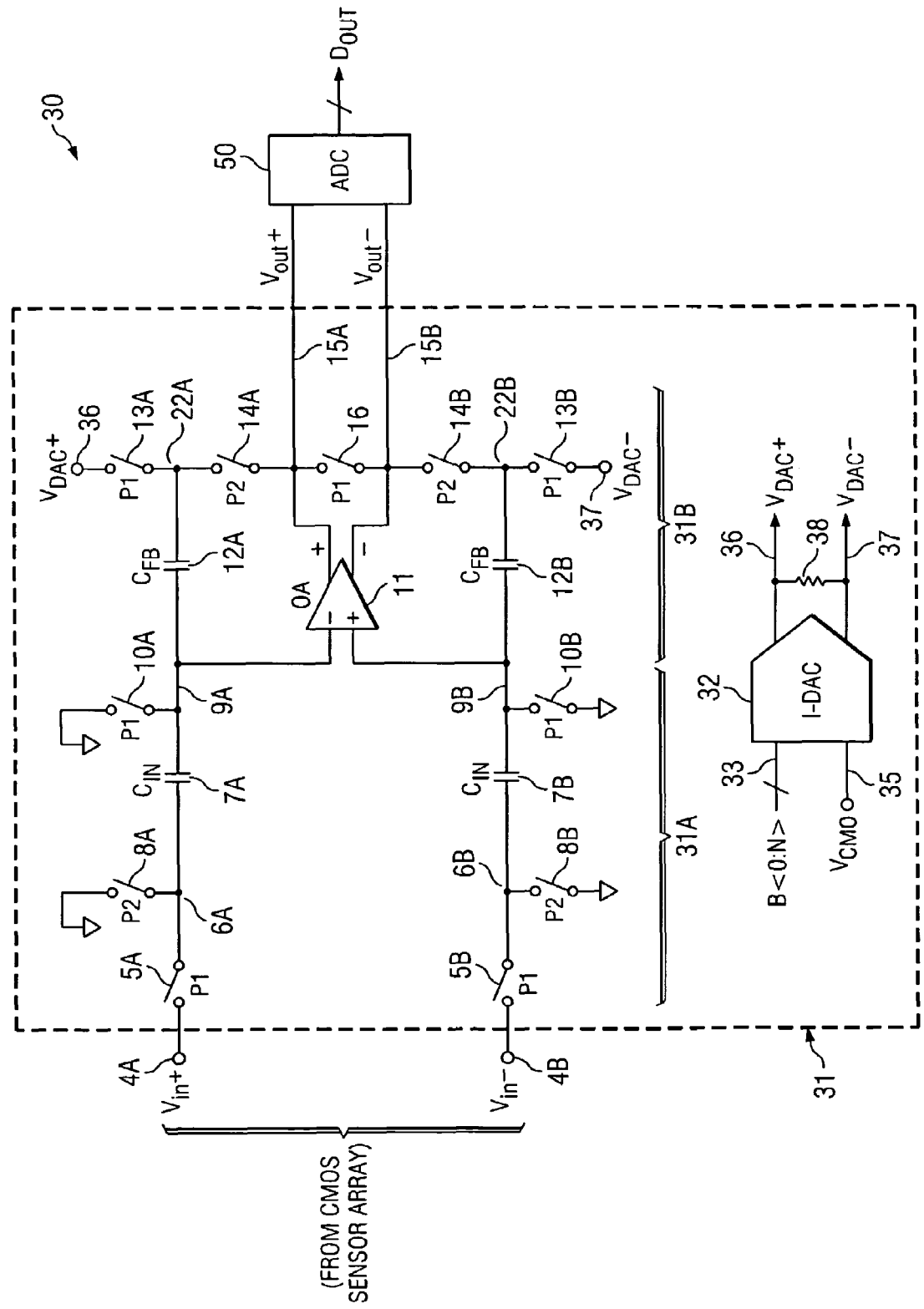
FIG. 3 is a schematic diagram of a preferred embodiment of the present invention.

Referring to FIG. 3, offset-compensated switched-capacitor ADC system 30 includes an "offset-compensated" switched-capacitor sample/hold circuit 31 which samples and holds analog input signals received from, for example, one or more CMOS sensor channels (not shown). Offset-compensated switched-capacitor ADC system 30 also includes an ADC 50 having its inputs connected to receive the output signal Vout$^+$−Vout$^−$ produced by offset-compensated switched-capacitor ADC sample/hold circuit 31. In the embodiment of FIG. 3, offset-compensated switched-capacitor sample/hold circuit 31 includes a switched-capacitor input stage 31A and a sample/hold amplifier stage 31B.

Switched-capacitor input stage 31A includes a sampling capacitor 7A having a first terminal connected by conductor 6A to one terminal of a switch 5A and one terminal of a switch 8A. The other terminal of switch 5A is connected by conductor 4A to receive input signal Vin$^+$, and the other terminal of switch 8A is connected to a suitable reference voltage, such as ground. The other terminal of input capacitor 7A is connected by conductor 9A to the (−) input of operational amplifier 11 and to one terminal of a feedback capacitor 12A. The other terminal of feedback capacitor 12A is connected by conductor 22A to one terminal of a switch 13A and to one terminal of a switch 14A. The other terminal of switch 13A is connected by conductor 36 to receive an output voltage $V_{DAC}^+$ produced on conductor 36 by "continuous-time" offset DAC 32. The other terminal of switch 14A is connected by conductor 15A to the (+) output of operational amplifier 11, which produces the output voltage Vout$^+$ and applies it by means of conductor 15A to one input terminal of ADC 50.

Similarly, switched-capacitor input stage 31A includes a sampling capacitor 7B having one terminal connected by conductor 6B to one terminal of a switch 5B and one terminal of a switch 8B. The other terminal of switch 5B is connected by conductor 4B to receive the input signal Vin$^−$, and the other terminal of switch 8B is connected to ground. The other terminal of input capacitor 7B is connected by conductor 9B to the (+) input of operational amplifier 11 and to one terminal of a feedback capacitor 12B of capacitance $C_{FB}$. The other terminal of feedback capacitor 12B is connected by conductor 22B to one terminal of a switch 13B and to one terminal of a switch 14B. The other terminal of switch 13B is connected by conductor 37 to receive an output voltage $V_{DAC}^-$ produced by continuous-time offset DAC 32. The other terminal of switch 14B is connected by conductor 15B to the (−) output of operational amplifier 11, which applies the output voltage Vout⁻ to another input terminal of ADC 50. A reset switch 16 is connected between conductors 15A and 15B. ADC 50 produces a digital word DOUT which represents, in this example, the light intensity ambient on a CMOS sensor that produces the input signal Vin⁺−Vin⁻.

Switches 5A, 5B, 10A, 10B, 13A, 13B and 16 are controlled by "reset" signal P1, and switches 8A, 8B, 14A and 14B are controlled by "integrate" signal P2.

As subsequently explained, switched-capacitor input stage 31A can, in essence, be replicated multiple times and provided to sense and sample the output voltages of multiple CMOS sensor signal channels, respectively, and then multiplex the sampled signals to the inputs of sample/hold amplifier stage 31B. See the co-pending commonly assigned patent application entitled "MULTIPLE-BANK CMOS IMAGE SENSOR SYSTEM AND METHOD", by present inventor Ronald F. Cormier, Jr., Ser. No. 11/507,799, filed Aug. 22, 2006, and incorporated herein by reference.

Figure 4A:
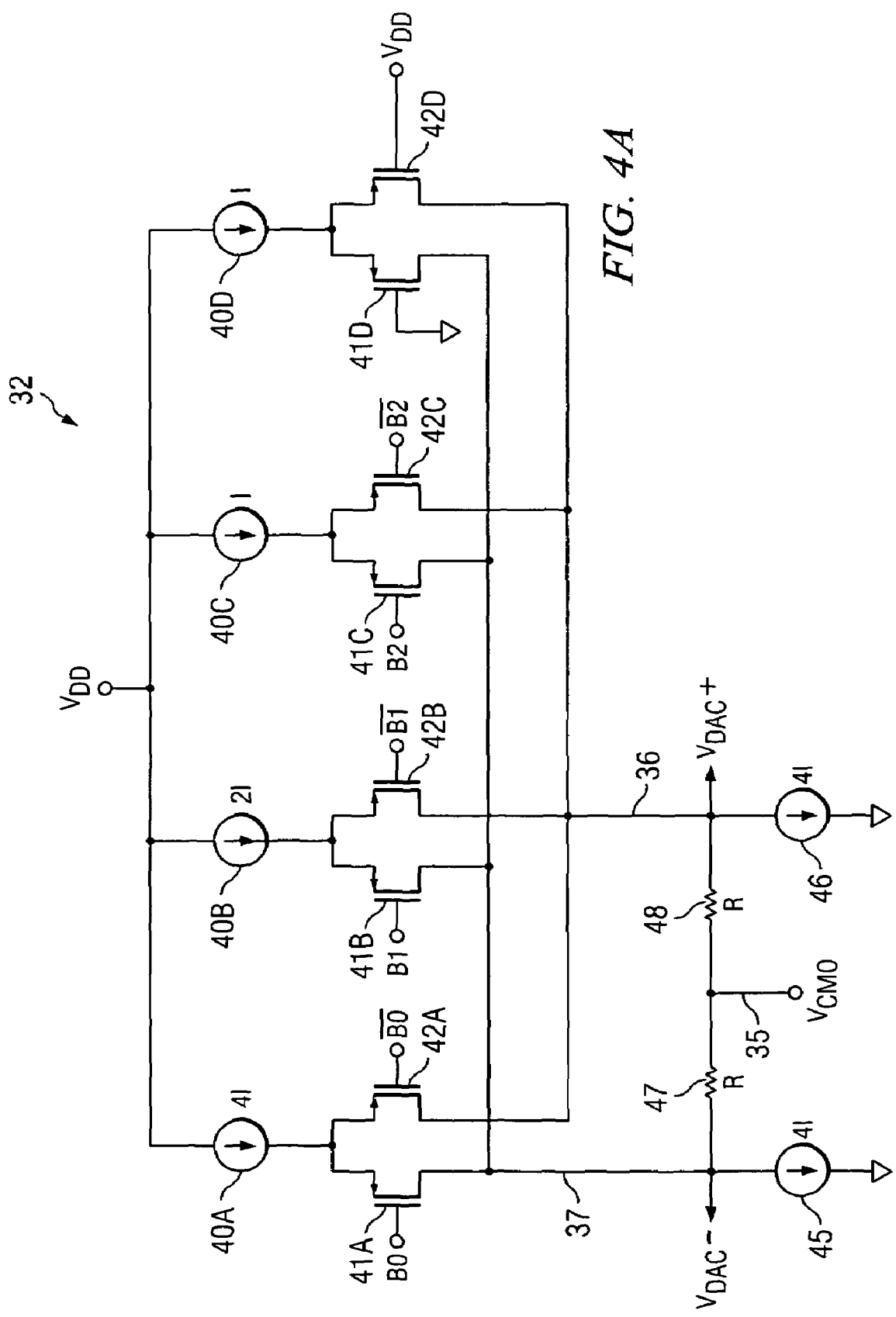
FIG. 4A is a schematic diagram of an implementation of the continuous-time current offset DAC in block 32 of FIG. 3.
Figure 4B:
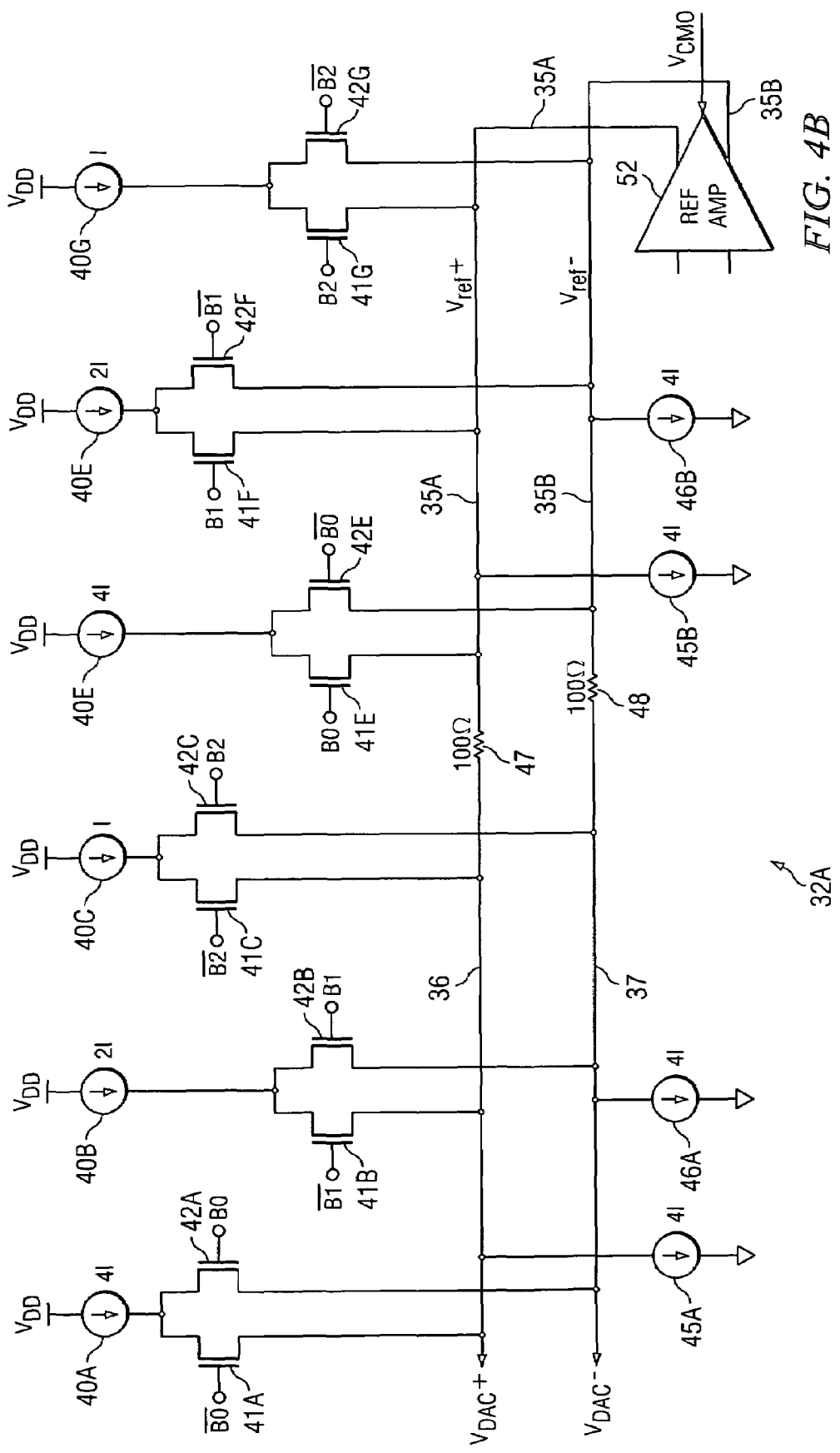
FIG. 4B is a partial schematic diagram of an alternative implementation of the continuous-time current offset DAC in block 32 of FIG. 3.

Continuous-time I-DAC ("current DAC") 32, referred to as "continuous-time offset DAC 32", alternative schematic diagrams of which are shown in FIGS. 4A and 4B, receives the common mode voltage $V_{CMO}$ on conductor 35, and also receives a N-bit digital input word B<0:N> on N-conductor bus 33. In response, continuous-time offset DAC 32 generates a differential output voltage $V_{DAC}^+ - V_{DAC}^-$ across an output resistor 38 coupled between conductors 36 and 37, typically so that $V_{DAC}^+$ and $V_{DAC}^-$ are symmetrically "balanced" about the common mode voltage $V_{CMO}$.

Referring to FIG. 4A, a 3-bit implementation of continuous-time offset DAC 32 includes three binarily weighted current sources 40A,B,C producing currents of 4I, 2I, and I, respectively, and four pairs of differentially coupled steering transistors which direct the three binarily weighted currents and also an additional current I from current source 40D into conductors 36 and 37, according to the value of a three-bit binary input word B0,1,2 representing the above-mentioned "dark light offset voltage". The sources of P-channel transistors 41A and 42A are connected to current source 40A, and their drains are connected to conductors 37 and 36, respectively. The gate of transistor 41A is connected to receive the input bit B0 and the gate of transistor 42A is connected to receive the logical complement signal $\overline{B0}$. The sources of P-channel transistors 41B and 42B are connected to current source 40B, and their drains are connected to conductors 37 and 36, respectively. Similarly, the gate of transistor 41B is connected to receive the input bit B1 and the gate of transistor 42B is connected to receive the logical complement signal $\overline{B1}$. The sources of P-channel transistors 41C and 42C are connected to current source 40C, and their drains are connected to conductors 37 and 36, respectively. The gate of transistor 41C is connected to receive the input bit B2, and the gate of transistor 42C is connected to receive the logical complement signal $\overline{B2}$. The sources of P-channel transistors 41D and 42D are connected to another current source 40D which produces a current I. The drains of transistors 41D and 42D are connected to conductors 37 and 36, respectively, and their gates are connected to ground and $V_{DD}$, respectively. Transistors 41D and 42D provide the necessary offset current to balance the differential output $V_{DAC}^+ - V_{DAC}^-$ about the common mode voltage $V_{CMO}$. (Those skilled in the art will recognize that transistor 42D never turns on and transistor 41D never turns off and could be replaced by a short-circuit, but that using transistors 41D and 42D which are matched to the other current steering transistors as shown provides the advantage of balanced associated parasitic devices in the integrated circuit structure.)

Conductors 37 and 36 are also coupled to current sources 45 and 46, respectively. Conductor 37 is connected to one terminal of a resistor 47 of resistance R and conductor 36 is connected to one terminal of a resistor 48 of resistance R. The other terminals of resistors 47 and 48 are connected by conductor 35 to receive the common mode voltage $V_{CMO}$. Current sources 45 and 46 each produce a current 41.

Referring to FIGS. 3 and 4A, only a single input sampling capacitor 7A is required for sampling Vin⁺, and only a single input sampling capacitor 7B is required for sampling Vin⁻. Therefore, the gain of switched-capacitor sample/hold circuit 31A,31B is proportional to $C_{IN}/C_{FB}$, as in a typical switched-capacitor amplifier. The two feedback capacitors 12A and 12B can be precharged, respectively, to preset values slightly greater than and slightly less than the common mode voltage $V_{CMO}$ such that the difference in the precharged values is equal to the "dark light offset voltage" characteristic of the CMOS sensors. Specifically, in the offset-compensated switched-capacitor sample/hold circuit 31 of FIG. 3, the "dark light offset voltage" is the difference between the value of $V_{DAC}^+$ to which feedback capacitor 12A is pre-charged and the value of $V_{DAC}^-$ to which feedback capacitor 12B is pre-charged. In an alternate configuration shown in FIG. 4B, an additional differential reference voltage Vref=Vref⁺−Vref⁻ is also summed with a "dark light offset voltage".

In FIG. 4A, fixed current source 45 producing current 41 is connected by conductor 37 to one terminal of resistor 47 of resistance R, and similarly, fixed current source 46 producing current 41 is connected by conductor 36 to one terminal of resistor 48 of resistance R. A certain amount of current is steered into each of nodes 36 and 37, depending on the value of the digital input word B0,B1,B2. Depending on the direction of the net current flow through resistors 47 and 48, an offset voltage is generated between $V_{DAC}^+$ and $V_{DAC}^-$. $V_{DAC}^+$ and $V_{DAC}^-$ then are used in the precharging of feedback capacitors 12A and 12B, respectively, so as to compensate for the above described "dark light offset voltage" produced by the CMOS sensors being sensed.

Note that a simple 3 bit continuous-time offset DAC example is shown in FIG. 4A. However, a practical implementation of this circuit wherein multiple sampled input signals are multiplexed to the input of the sample/hold amplifier of a switched-capacitor sample/hold circuit is more complex, but the basic architecture using a continuous-time offset DAC to superimpose the "dark light offset voltage" onto the sampled and held voltage is essentially the same as shown in FIG. 3.

FIG. 4B shows the above mentioned alternative configuration 32A of continuous-time offset DAC 32, and includes two groups of pairs of P-channel current steering transistors. The first group includes transistors 41A and 42A having their gates connected to $\overline{B0}$ and B0, respectively, their sources connected to a most significant bit current source 40A which produces, for example, a current 41, and their drains connected to conductors 36 and 37, respectively. The first group also includes transistors 41B and 42B having their gates connected to $\overline{B1}$ and B1, respectively, having their sources connected to a second most significant bit current source 40B which produces a current 2I, and their drains connected to conductors 36 and 37, respectively. The first group further includes transistors 41C and 42C having their gates connected to $\overline{B2}$ and B2, respectively, their sources connected to a least significant bit current source 40C which produces a current I, and their drains connected to conductors 36 and 37, respectively.

Similarly, the second group includes transistors 41E and 42E having their gates connected to B0 and $\overline{B0}$, respectively, their sources connected to a most significant bit current source 40E which produces a current 41, and their drains connected to Vref$^+$ conductor 35A and Vref$^-$ conductor 35B, respectively. The second group also includes transistors 41F and 42F having their gates connected to B1 and $\overline{B1}$, respectively, their sources connected to a second most significant bit current source 40F which produces a current 21, and their drains connected to Vref$^+$ conductor 35A and Vref$^-$ conductor 35B, respectively. The second group further includes transistors 41G and 42G having their gates connected to B2 and $\overline{B2}$, respectively, their sources connected to a least significant bit current source 40G which produces a current I, and having their drains connected to Vref$^+$ conductor 35A and Vref$^-$ conductor 35B, respectively.

In FIG. 4B, resistors 47 and 48 are separated and are not connected to conductor 35 or $V_{CMO}$. Instead, continuous-time offset DAC circuitry 32A includes a reference voltage amplifier 52 that produces one reference voltage Vref$^+$, for example 2 volts, on conductor 35A and another reference voltage Vref$^-$, for example 1 volt, on conductor 35B. (In this case the 2 volt Vref$^+$ and the 1 volt Vref$^-$ would be equally balanced above and below a common mode voltage of 1.5 volts.) Alternatively, the two reference voltages Vref$^+$ and Vref$^-$ can be equal. Resistor 47 is connected between Vref$^+$ on conductor 35A and offset DAC output voltage $V_{DAC}^+$ on conductor 36. Similarly, resistor 48 is connected between Vref$^-$ on conductor 35B and offset DAC output voltage $V^{DAC-}$ on conductor 37. Fixed current source 45A produces a current 41 flowing out of conductor 36, and fixed current source 46A produces a current 41 flowing out of conductor 37. Similarly, fixed current source 46A produces a current 41 flowing out of conductor 36, fixed current source 45B produces a current 41 flowing out of conductor 35B and fixed current source 46B produces a current 41 flowing out of conductor 46B.

Referring again to FIG. 4A, if the digital input word B0,B1,B2 representing the measured dark light offset voltage of the CMOS sensor output signals is equal to the binary value 100, all of the currents, including currents flowing into conductor 36 and 37 from the DAC current steering transistors, are equal. However, any other values of digital input word B0,B1,B2 result in the circuit 32A being unbalanced so as to cause current to go in one direction or the other through the resistors 47 and 48 to symmetrically generate offset voltages across resistors 47 and 48. This causes $V_{DAC}^+$ and $V_{DAC}^-$ to be symmetrically greater than and less than, respectively, the common mode voltage $V_{CMO}$.

Because the circuit implementation shown in FIG. 4B does not include an additional current source such as 40D in FIG. 4A, there is always a 1 LSB current provided by reference voltage amplifier 52. However, since the 1 LSB current is very small, this greatly simplifies the design of reference amplifier 52. Likewise, a 1 LSB current into resistors 47,48 will be produced in response to the binary input word 100.

Figure 5:
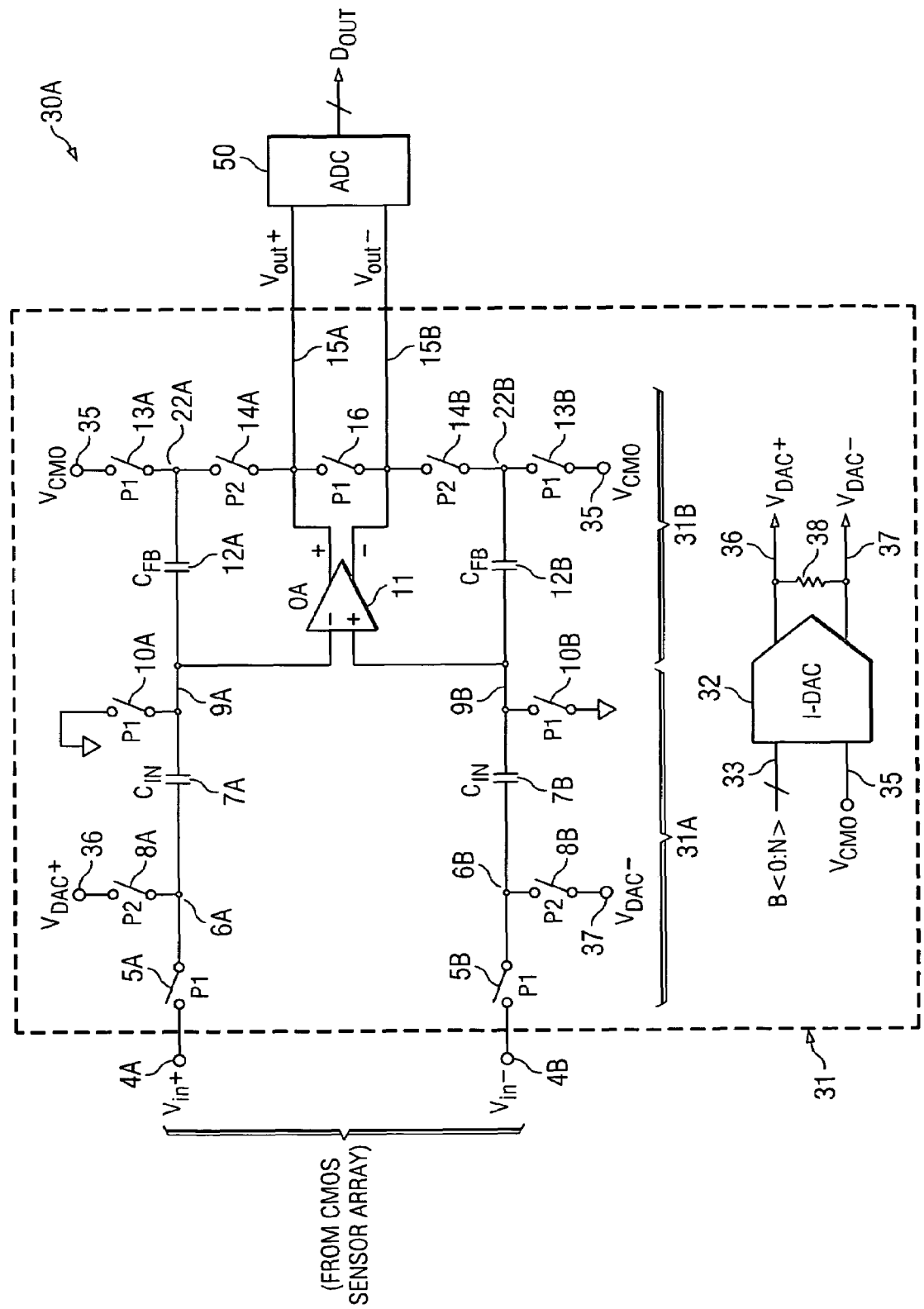
FIG. 5 is a schematic diagram of another embodiment of the present invention, similar to FIG. 3 except that the output of the continuous-time current offset DAC in block 32 is coupled to the input sampling capacitors rather than the feedback capacitors.

It should be appreciated that the "dark light offset voltage" can be referenced to $V_{CMO}$ or to Vref+ and Vref−, and there are several points in the switched-capacitor circuitry at which $V_{DAC}^+$ and $V_{DAC}^-$ can be connected so as to subtract or compensate for the dark light offset voltage characteristic of the sampled CMOS sensor output signals. For example, as shown in FIG. 5, the outputs $V_{DAC}^+$ and $V_{DAC}^-$ of continuous-time current offset DAC 32 can be coupled to sampling capacitors 7A and 7B instead of feedback capacitors 12A and 12B. input sample capacitors 7A and 7B are coupled by means of switches 10A and 10B to effectively subtract the dark light offset voltage from the output signal Vout$^+$−Vout$^-$ before it is converted to a digital number by ADC 50. The arrangement in FIG. 5 requires DAC circuit settling to occur simultaneously with sample and hold circuit settling and therefore is slower. The arrangement in FIG. 3 allows DAC circuit settling to occur during the phase before the sample and hold circuit settling.

It also should be appreciated that if there are multiplexed inputs from multiple CMOS sensor channels to the inputs of the sample/hold amplifier 11, an important reason for superimposing the dark light offset voltage onto the feedback capacitors rather than the input sampling capacitors is that connections of the two feedback capacitors are common to all of the multiplexed inputs. Therefore, connecting the outputs of a single offset DAC 32 to one pair of feedback capacitors is much simpler than connecting the outputs of multiple offset DACs to multiple corresponding pairs of input sampling capacitors.

Thus, the invention provides a switched-capacitor sample/hold circuit which uses a continuous-time offset DAC either to symmetrically superimpose an offset voltage onto voltages to which the two feedback capacitors are respectively precharged during the reset phase P1, or alternatively, to symmetrically superimpose the offset voltage onto the two input sampling capacitors during the integrate phase P2, so as to achieve the same effect. The described technique and structure provide the advantage that no additional switches or capacitors are required in the switched-capacitor sample/hold circuitry in order to accomplish the needed dark light offset voltage compensation. The described technique and structure also provide the further advantage that the circuit nevertheless performs as fast as a simple sample/hold circuit, and with the same noise performance.

In contrast, the switched-capacitor offset DACs used in the prior art require more capacitors, switches, and signal routing conductors, and thereby degrade the feedback factor, circuit operating speed, and circuit noise. Furthermore, use of switched-capacitor offset DACs of the prior art makes it cumbersome to multiplex multiple transducer output signal channels to the input of the sample/hold amplifier of an offset-compensated switched-capacitor ADC system.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, transducers other than CMOS sensors have characteristic offsets associated with their output signals, and the invention is equally applicable to compensating switched-capacitor sample/hold circuit's and ADCs for such offsets. Furthermore, the described preferred embodiments are differential circuit embodiments, but the invention applies equally well to single ended circuit embodiments.

What is claimed is:

1. Circuitry including a switched-capacitor sample/hold circuit, comprising:

(a) a switched-capacitor input sampling stage including a first input sampling capacitor for sampling a first input voltage;
(b) a sample/hold amplifier circuit including an operational amplifier having a first input coupled to the first input sampling capacitor, a first feedback capacitor coupled between the first input and a first output of the operational amplifier, and first switching circuitry coupling the first feedback capacitor to the first output of the operational amplifier;
(c) a continuous-time offset DAC (digital to analog converter) receiving a digital input signal representative of an offset voltage and having a first output producing a first offset correction voltage to represent the offset voltage; and
(d) second switching circuitry for coupling the first offset correction voltage to the switched-capacitor sample/hold circuit to adjust an amount of pre-charging of the first feedback capacitor in accordance with the digital input signal.

2. The circuitry of claim 1 wherein the switched-capacitor input sampling stage includes a second sampling capacitor for sampling a second input voltage, wherein the operational amplifier includes a second input coupled to the second input sampling capacitor, and wherein a second feedback capacitor is coupled between the second input and a second output of the operational amplifier, and wherein the first switching circuitry couples the second feedback capacitor to the second output of the operational amplifier, and wherein the continuous-time offset DAC includes a second output producing a second offset correction voltage to represent the offset voltage, and wherein the second switching circuitry couples the second offset correction voltage to the switched-capacitor sample/hold circuit to adjust an amount of pre-charging of the second feedback capacitor in accordance with the digital input signal.

3. The circuitry of claim 2 wherein the first switching circuitry includes a first switch controlled by an integrate phase signal and coupled between a first terminal of the first feedback capacitor and the first output of the operational amplifier, and a second switch controlled by the integrate phase signal and coupled between a first terminal of the second feedback capacitor and the second output of the operational amplifier.

4. The circuitry of claim 3 wherein the second switching circuitry includes a third switch controlled by a reset phase signal and coupled between the first terminal of the first feedback capacitor and the first output of the continuous-time offset DAC, and a fourth switch controlled by the reset phase signal and coupled between the first terminal of the second feedback capacitor and the second output of the continuous-time offset DAC.

5. The circuitry of claim 4 wherein the switched-capacitor input sampling stage includes a fifth switch controlled by the reset phase signal and coupled between a second terminal of the first feedback capacitor and a reference voltage conductor, a sixth switch controlled by the reset phase signal and coupled between a second terminal of the second feedback capacitor and the reference voltage conductor, a first terminal of the first input sampling capacitor being connected to the second terminal of the first feedback capacitor and a first terminal of the second input sampling capacitor being connected to the second terminal of the second feedback capacitor, a seventh switch controlled by the integrate phase signal being coupled between the reference voltage conductor and a second terminal of the first input sampling capacitor, and an eighth switch controlled by the integrate phase signal being coupled between the reference voltage conductor and a second terminal of the second input sampling capacitor.

6. The circuitry of claim 3 wherein the second switching circuitry includes a third switch controlled by the integrate phase signal coupled between the first offset correction voltage and a first terminal of the first input sampling capacitor, and a fourth switch controlled by the integrate phase signal coupled between the second offset correction voltage and a first terminal of the second input sampling capacitor.

7. The circuitry of claim 6 including a fifth switch controlled by a reset phase signal and coupled between the first terminal of the first feedback capacitor and a common mode voltage, and a sixth switch controlled by the reset phase signal and coupled between the second terminal of the second feedback capacitor and the common mode voltage.

8. The circuitry of claim 1 wherein the first input voltage is produced by a transducer.

9. The circuitry of claim 8 wherein the first input voltage is produced by a CMOS light sensor.

10. The circuitry of claim 1 wherein the continuous-time offset DAC includes a current DAC producing an output current which flows through an output resistor to produce the first offset correction voltage in response to the digital input signal.

11. The circuitry of claim 2 wherein the continuous-time DAC includes N pairs of current steering transistors operative to selectively steer each of N corresponding binarily weighted current sources into one or the other of the first and second outputs of the continuous-time DAC in accordance with corresponding bits of the digital input signal, a first constant current source coupled to sink current from the first output of the continuous-time DAC, a second constant current source coupled to sink current from the second output of the continuous-time DAC, a first output resistor coupled between the first output of the continuous-time DAC and a common mode voltage, and a second output resistor coupled between the second output of the continuous-time DAC and the common mode voltage.

12. The circuitry of claim 2 wherein the continuous-time DAC includes
a first group including N pairs of current steering transistors operative to selectively steer each of N corresponding binarily weighted current sources into one or the other of the first and second outputs of the continuous-time DAC in accordance with corresponding bits of the digital input signal;
a reference amplifier producing a first reference voltage on a first reference voltage conductor and a second reference voltage on a second reference voltage conductor;
a second group including N pairs of current steering transistors operative to selectively steer each of N corresponding binarily weighted current sources into one or the other of the first and second reference voltage conductors in accordance with corresponding bits of the digital input signal;
a first constant current source coupled to sink current from the first output of the continuous-time DAC, a second constant current source coupled to sink current from the second output of the continuous-time DAC, a third constant current source coupled to sink current from the first reference voltage conductor, and a fourth constant current source coupled to sink current from the second reference voltage conductor; and
a first output resistor coupled between the first output of the continuous-time DAC and the first reference voltage conductor, and a second output resistor coupled between the second output of the continuous-time DAC and the second reference voltage conductor.

13. The circuitry of claim 1 including an ADC (analog to digital converter) having an input coupled to the first output of the operational amplifier.

14. The circuitry of claim 12 wherein a current produced by the binarily weighted current source of a most significant pair of current steering transistors of the first group is equal to a current produced by the binarily weighted current source of a most significant pair of current steering transistors of the second group, and also is equal to currents produced by the first, second, third, and fourth constant current sources.

15. The circuitry of claim 5 wherein the switched-capacitor sample/hold circuit includes a ninth switch controlled by the reset phase signal coupled between the first and second outputs of the operational amplifier.

16. A method of operating a switched-capacitor sample/hold circuit including a switched-capacitor input sampling stage and a sample/hold amplifier circuit including an operational amplifier having a first input coupled to a first input sampling capacitor, and a first feedback capacitor coupled between the first input and a first output of the operational amplifier, the method comprising
    (a) operating a continuous-time offset DAC (digital to analog converter) having a digital input signal representative of an offset voltage component of an input voltage sampled by the switched-capacitor input sampling stage to produce a first offset correction voltage; and
    (b) coupling the first offset correction voltage to the switched-capacitor sample/hold circuit to adjust an amount of pre-charging of the first feedback capacitor in accordance with the value of the digital input signal to compensate the offset voltage component.

17. The method of claim 16 wherein the operational amplifier includes a second input coupled to a second input sampling capacitor and a second feedback capacitor coupled between the second input and a second output of the operational amplifier, the method including operating the continuous-time offset DAC to produce a second offset correction voltage to adjust an amount of pre-charging of the second feedback capacitor in accordance with the digital input signal to compensate the offset component.

18. The method of claim 16 wherein step (b) includes coupling the first terminal of the first feedback capacitor to the first output of the continuous-time offset DAC during a reset phase signal.

19. The method of claim 16 wherein step (b) includes coupling a terminal of the first input sampling capacitor to the first output of the continuous-time offset DAC during an integrate phase signal.

20. Circuitry including a switched-capacitor sample/hold circuit, comprising:
    (a) a switched-capacitor sample/hold circuit including a switched-capacitor input sampling stage and a sample/hold amplifier circuit including an operational amplifier having a first input coupled to a first input sampling capacitor, and a first feedback capacitor coupled between the first input and a first output of the operational amplifier;
    (b) continuous-time offset DAC (digital to analog converter) means having a digital input signal representative of an offset voltage component of an input voltage sampled by the switched-capacitor input sampling stage to produce a first offset correction voltage; and
    (c) means for coupling the first offset correction voltage to the switched-capacitor sample/hold circuit to adjust an amount of pre-charging of the first feedback capacitor in accordance with the value of the digital input signal to compensate the offset voltage component.

* * * * *